(12) United States Patent
Dudus et al.

(10) Patent No.: US 12,292,682 B2
(45) Date of Patent: May 6, 2025

(54) METHOD AND DEVICE FOR PRODUCING MICRO- AND/OR NANOSTRUCTURES

(71) Applicant: EV Group E. Thallner GmbH, St. Florian am Inn (AT)

(72) Inventors: Anna Dudus, St. Florian am Inn (AT); Dominik Treiblmayr, St. Florian am Inn (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 203 days.

(21) Appl. No.: 18/011,276

(22) PCT Filed: Jul. 6, 2020

(86) PCT No.: PCT/EP2020/068998
§ 371 (c)(1),
(2) Date: Dec. 19, 2022

(87) PCT Pub. No.: WO2022/008033
PCT Pub. Date: Jan. 13, 2022

(65) Prior Publication Data
US 2023/0229076 A1 Jul. 20, 2023

(51) Int. Cl.
*G03F 7/00* (2006.01)
(52) U.S. Cl.
CPC ................................ *G03F 7/0002* (2013.01)
(58) Field of Classification Search
CPC .................................................... G03F 7/0002
See application file for complete search history.

(56) References Cited

U.S. PATENT DOCUMENTS

| | | | |
|---|---|---|---|
| 6,482,742 B1 * | 11/2002 | Chou | B29C 43/021 |
| | | | 264/293 |
| 7,442,336 B2 | 10/2008 | Choi et al. | |
| 7,708,926 B2 | 5/2010 | Choi et al. | |
| 7,910,042 B2 | 3/2011 | Choi et al. | |
| 8,057,725 B2 | 11/2011 | Choi et al. | |
| 8,871,048 B2 | 10/2014 | Chen et al. | |
| 9,116,424 B2 | 8/2015 | Lindner et al. | |
| 9,194,700 B2 | 11/2015 | Kast et al. | |
| 10,239,253 B2 | 3/2019 | Lindner et al. | |

(Continued)

FOREIGN PATENT DOCUMENTS

| | | |
|---|---|---|
| EP | 2 287 666 A1 | 8/2009 |
| EP | 2 612 109 B1 | 9/2010 |

(Continued)

OTHER PUBLICATIONS

Office Action issued in Japanese Patent Application No. 2022-580894 dated Mar. 21, 2024 along with the English-language translation.

(Continued)

*Primary Examiner* — Steven H Whitesell
(74) *Attorney, Agent, or Firm* — RENNER, OTTO, BOISSELLE & SKLAR, LLP

(57) ABSTRACT

A method for producing micro- and/or nanostructures includes fixing a substrate with an embossing material on a substrate accommodating device, contacting of a structured stamp with the embossing material, curing of the embossing material, and removal of the embossing material from the structured stamp.

11 Claims, 5 Drawing Sheets

(56) References Cited

U.S. PATENT DOCUMENTS

| | | |
|---|---|---|
| 10,627,715 B2 | 4/2020 | Choi |
| 11,143,957 B2 | 10/2021 | Choi |
| 2005/0061773 A1* | 3/2005 | Choi ............... C23F 1/08 216/44 |
| 2008/0174046 A1 | 7/2008 | Choi et al. |
| 2010/0140841 A1 | 6/2010 | Choi et al. |
| 2010/0270705 A1* | 10/2010 | Okushima ........... B82Y 40/00 264/293 |
| 2011/0045185 A1 | 2/2011 | Lindner et al. |
| 2011/0140302 A1 | 6/2011 | Choi et al. |
| 2011/0180965 A1 | 7/2011 | Zhang et al. |
| 2011/0217479 A1 | 9/2011 | Yamashita et al. |
| 2013/0162997 A1 | 6/2013 | Kast et al. |
| 2014/0239529 A1* | 8/2014 | Tan ............... G03F 9/703 425/170 |
| 2015/0251349 A1 | 9/2015 | Lindner et al. |
| 2016/0129612 A1 | 5/2016 | Seki et al. |
| 2018/0117805 A1 | 5/2018 | Choi |
| 2020/0225575 A1 | 7/2020 | Choi |

FOREIGN PATENT DOCUMENTS

| | | |
|---|---|---|
| JP | 2007-502715 A | 2/2007 |
| JP | 2014-069339 A | 4/2014 |
| JP | 2016-096327 A | 5/2016 |
| JP | 2018-074159 A | 5/2018 |
| WO | WO-2012/020741 A1 | 2/2012 |

OTHER PUBLICATIONS

International Search Report from corresponding International Patent Application No. PCT/EP2020/068998, dated Mar. 12, 2021.
Written Opinion from corresponding International Patent Application No. PCT/EP2020/068998, dated Mar. 12, 2021.

* cited by examiner

METHOD AND DEVICE FOR PRODUCING MICRO- AND/OR NANOSTRUCTURES

FIELD OF THE INVENTION

The invention relates to a device and a method for producing micro- and/or nanostructures.

BACKGROUND OF THE INVENTION

In the prior art, micro- and/or nanostructures are produced either photolithographically and/or with the aid of imprint lithography. In recent years, imprint lithography has primarily become established. With the aid of imprint lithography, it is possible to emboss micro- and/or nanometre-size structures in a material by means of a stamp. The material is an embossing material applied on a substrate.

Such imprint processes have increasingly gained in importance in recent years, since they can be carried out more quickly, more effectively and at a lower cost than many photolithographic processes.

After the deposition of the embossing material, an alignment of the structured stamp relative to the substrate takes place. The structured stamp and the substrate then approach one another. The structures of the structured stamp are formed in the embossing material. Before the removal of the structured stamp from the embossing material, the latter is cured. The curing takes place thermally and/or by means of electromagnetic radiation.

Apart from modified or extended mask aligners, there are also separate imprint apparatuses, which have been designed on and for special embodiments. These apparatuses are for the most part highly precise alignment systems which are capable of aligning a stamp with the substrate with still higher precision. Furthermore, these apparatuses are capable of creating a vacuum, have special dispensing systems and suchlike.

The embossing techniques work either with hard or soft stamps. Among the embossing lithography techniques, it is primarily the use of so-called soft stamps that is always preferred. The reason lies in the easy production of the stamps, efficient embossing processes, very good surface properties of the respective stamp materials, low production costs, reproducibility of the embossed product and above all in the possibility of elastic deformation of the stamp during the embossing and removal from the moulding position. A stamp made of polymer, in particular an elastomer with a micro- or nanostructured surface, is used in soft lithography, in order to produce structures in the range from less than nm up to >1000 µm.

Elastomer stamps are produced as a negative of a master. The master stamp is a hard stamp made of metal, plastic and/or ceramic, which is produced once by correspondingly expensive processes. Any number of elastomer stamps can then be produced from the master. The modulus of elasticity of quartz amounts to approximately 100 GPa. In comparison, the moduli of elasticity of polymers (hard and soft polymers) are up to several orders of magnitude smaller, consequently the latter compared to quartz are referred to as "soft" (soft lithography). The elastomer stamps enable a conformal, uniform contact over large surfaces. They are relatively easy to separate from their master stamp, and from the embossed products. In order to ensure a good separation of the stamp and the substrate, the stamp surface has a surface energy as low as possible. For example, an anti-adhesion coating is often necessary or advantageous.

In order to carry out soft lithography processes, it is possible to support the elastomer stamp by means of a carrier. For example, glass carrier substrates with different thicknesses are currently used. When use is made of thick glass substrates, the elastomer stamp at least partially loses its flexibility. On the other hand, the flexibility of the stamp can be controlled by the selection of the carrier. The use of rigid carriers generally makes the separation of the stamp and the substrate difficult after the embossing process.

Similarly, thin substrates according to the prior art require a substrate carrier for better handling. The known soft lithography processes include for example micro- and/or nano-contact printing (µ/nCP) and nanoimprint lithography (NIL).

In the case of nanoimprint lithography, the curing of the embossing material can take place thermally or by means of UV radiation. In both cases, the structured stamp is pressed into the embossing material. The structured stamp and the substrate are pressed together by pressure, in order that a high-resolution surface structuring can be carried out. In the case of UV-NIL, it is possible to work with smaller contact pressures compared to the thermal NIL and the process can take place at room temperature. The most important parameters in the NIL processes are the temperature (above all in the case of thermal NIL), the press-in pressure and the adhesion between the embossing material and the structured stamp.

Soft as well as less soft stamps, in particular elastomer stamps, can be deformed by the applied pressure during the nanoimprint process. This deformation is pressure-dependent. It is to be expected that these deformations have a greater influence in the case of smaller structures and are more marked in the case of softer stamp materials. The deformations or distortions of micro- and nanostructures arising due to contact pressure are found in the cured embossing material on the embossed substrate and thus reduce the quality and the reproducibility of the embossing processes.

If structured stamps and/or the substrate are too stiff, an external pressure, in particular a contact pressure, is required, in order to achieve a conformal or seamless contact between the structured stamp with the stamp structures and the substrate with the embossing material. In the prior art, actuator devices are used, which comprise separately controllable or regulatable actuators for acting upon the structured stamp and/or the substrate with a force serving to transfer the stamp structure and resulting orthogonal to the substrate contact surface.

Precisely in the case of larger areas, it is difficult to distribute the pressure uniformly over the entire contact surface and to compensate for irregularities. An inhomogeneous structuring can thus occur in embossing.

A possible inhomogeneity of the stamp surface also has an effect on the quality of the embossing process. Furthermore, gas inclusions during the embossing with pressure and the embossing defects associated therewith are known in the prior art.

Embossing defects which can occur with NIL are for example cracks, irregularly filled stamp structures (i.e. for example air inclusions), and a non-uniform lacquer layer thickness.

The less widespread capillary force lithography (CFL) is also one of the soft lithography processes and is based on the use of capillary forces for filling stamp structures without external pressure. In Adv. Funct. Mater. (2002) 12: 405-413, CFL is described in detail by the eponym H. H. Lee. The elastomer stamp is brought into conformal contact with the substrate. For filling of the cavities, however, the embossing material must have a very low viscosity. CFL is therefore carried out at higher temperatures and/or the solvent proportion in the embossing material is high and a solvent atmosphere is often necessary. Almost exclusively pure PDMS is used as a stamp material in CFL, since PDMS is permeable for solvents and for gases. During embossing with the PDMS stamp, the cavities are filled under the effect of the capillary forces and the solvent from the embossing material can diffuse through the PDMS stamp and escape. The epoxy material SU-8 has become established as the embossing material for CFL. Problems such as the swelling of PDMS in the solvent-based process and the marked expansion in the thermally based process mean that the CFL is carried out only on the laboratory scale and no industrial implementation with imprint apparatuses is known. Furthermore, the embossing material is usually thermally cross-linked in CFL.

In U.S. Pat. No. 7,442,336 B2, for example, a device and a method for embossing a substrate with an embossing material is specified, wherein the substrate and the stamp are slowly brought closer together up to a defined distance, so that the intermediate spaces are filled with the embossing material due to the capillary forces. The external force is kept as small as possible, depending on the properties of the embossing material, the thickness of the layer to be embossed and the size of the substrate surface.

In U.S. Pat. No. 8,871,048 B2, a flexible elastomer stamp is used, so that the external pressing force can be kept as low as possible.

Micro-forming in capillaries (MIMIC) also uses the capillary forces in order to produce structures with PDMS stamps. In MIMIC, however, a PDMS stamp with a relief structure is pressed onto a substrate. A three-dimensional structured hollow thus arises between the stamp and the substrate. A monomer solution is applied in front of the stamp, which then spontaneously fills the capillaries. After the curing, the stamp can be removed from the substrate. A three-dimensional structure of the polymer remains on the substrate.

In the prior art, it is particularly problematic that the elastic properties of soft stamps lead to deformations or distortions of micro- and nanostructures. The deformations and distortions of micro- and nanostructures arising due to contact pressure are found in the cured embossing material on the embossed substrate and thus reduce the quality and reproducibility of the embossing processes.

Soft stamps can be deformed during the nanoimprint process on account of the applied pressure. This deformation is in particular pressure-dependent. Furthermore, gas inclusions when embossing with pressure and the embossing defects associated therewith are known in the prior art.

If the structured stamp and/or the substrate are too stiff, an external pressure, i.e. contact pressure, is required to achieve a conformal, seamless contact between the structured stamp and the substrate with the embossing material. Pressure-dependent deformations can thus arise, which reduce the quality of the embossing processes.

The aim of the present invention, therefore, is to specify a device and a method as well as a substrate, which at least partially eliminate, in particular completely eliminate, the drawbacks mentioned in the prior art.

SUMMARY OF THE INVENTION

The aim of the present invention is accomplished with the features of the independent claims. Advantageous developments of the invention are given in the sub-claims. All combinations of at least two features given in the description, the claims and/or the drawings also fall within the scope of the invention. In stated value ranges, values lying inside the stated limits are also deemed to be disclosed as limiting values and can be claimed in any combination. Insofar as features disclosed in respect of the device can also be perceived as features of the method, the latter should also apply as being according to the method and vice versa.

In the following, structuring and embossing are understood to mean the production of micro- and/or nanostructures. In particular, no contact pressure should occur in embossing.

The invention describes a method and a device for producing micro- and/or nanometre-size structures. Amongst other things, the invention is based on the idea of solving the aforementioned technical problems in production by the use of very thin, in particular flexible substrates and using the capillary forces. After contact is made between the embossing material and the structured stamp, the fixing of the substrate is at least partially cancelled, preferably by means of at least one controllable fixing element, as result of which the embossing process is preferably initiated.

The invention thus concerns in particular a method and a device for the conformal contacting of the structured stamp and the embossing material without the use of an external pressure or without contact pressure of the structured stamp and embossing material in the embossing process.

Accordingly, the invention relates to a method for producing micro- and/or nanostructures, with at least the following steps in the following sequence:
a) fixing the substrate with the embossing material on a substrate accommodating device,
b) contacting of a structured stamp with an embossing material,
c) at least partially cancelling the fixing of the substrate,
d) curing of the embossing material,
f) removal of the embossing material from the structured stamp.

Furthermore, the invention relates to a device for producing micro- and/or nanostructures with the previously described method, wherein a substrate with an embossing material can be fixed on a substrate accommodating device, and wherein a structured stamp can be brought into contact with the embossing material, and wherein the fixing of the substrate can at least partially be cancelled, and wherein the embossing material can be cured, and wherein the embossing material can be removed from the structured stamp.

Furthermore, the invention relates to an article with micro- and/or nanostructures, wherein the micro- and/or nanostructures are produced with a method according to the invention and with a device according to the invention.

In a preferred embodiment of the invention, provision is made such that the substrate is flexible and can thus be adapted at least partially conformal with the structured stamp, in particular after the cancelling of the fixing or during the structuring of the embossing material. The substrate in particular has a small thickness and/or includes a partially flexible material, so that during production it can advantageously partially assume the structure of the structured stamp. The substrate can also not or completely adapt to the structured stamp. After the curing of the embossing material, the substrate with the cured embossing material forms in particular a unit. The substrate can thus advantageously assist the embossing process and prevent embossing defects. Furthermore, the thin flexible substrate can be deformed during the production process. In particular, the substrate is advantageously drawn towards the structured stamp in a conformal manner by the action of capillary forces and is thereby deformed. In addition, preferred uniform contacting during production is enabled by the flexibility. The flexibility of the substrate advantageously enables careful and uniform embossing without embossing defects. An additional degree of freedom is advantageously gained by the cancelling of the fixing, as a result of which the thin and flexible substrate, in particular due to the action of capillary forces, assists the production process in a desirable manner. After the cancelling of the fixing, the substrate is free on the substrate accommodating device. Due to the embossing material and the substrate being drawn towards the structured stamp, it is also conceivable for the substrate to be partially or completely lifted off from the substrate accommodating device, in particular by capillary forces. In particular, due to the flexibility of the substrate no external pressing force is required to transfer the structure to the embossing material. The substrate can in particular thus compensate for irregularities, so that the quality of the embossing process is further raised.

In another advantageous embodiment of the invention, provision is made such that, after the at least partial cancelling of the fixing of the substrate, an at least partial detachment of the substrate from the substrate accommodating device takes place, in particular by a relative movement of the substrate accommodating device and the substrate and/or by a relative movement of the substrate accommodating device and a stamp accommodating device and/or by capillary forces. The detachment can in particular lead to the creation of a spacing between the substrate and the substrate accommodating device. It is however also conceivable that the cancelling of the fixing does not lead to the detachment of the substrate or to the creation of a spacing. Furthermore, it is also possible, in particular by means of actuators, for a spacing to be created between the substrate and the substrate accommodating device after the at least partial cancelling of the fixing. The spacing created by the actuators is then advantageously adapted to the process, in particular to the material properties. Especially due to surface tensions and capillary forces, the substrate continues to adhere to the embossing material or is drawn towards the structured stamp, as result of which a degree of freedom of the substrate is advantageously also created. Corresponding to the arrangement of the substrate accommodating device with respect to the stamp accommodating device, further forces, in particular gravitational forces, can act during the embossing process. In particular, the spacing can also already be partially created during the contacting, in particular by a suction applied to of the substrate due to the capillary forces acting on the embossing material. Preferably, however, a spacing is not created until after the at least partial cancelling of the fixing. As a result of the spacing, the reproducibility and efficiency of the embossing process, in particular of a plurality of embossing steps carried out simultaneously and/or in parallel, can advantageously be improved. In addition, the substrate is able to deform and to adapt to the structured stamp as a result of the degree of freedom gained. In particular, embossing defects can thus be prevented.

In another advantageous embodiment of the invention, provision is made such that the structured stamp is a hard stamp or a soft stamp. In particular, the structured stamp can comprise a soft or hard embossing structure. A hard stamp is understood in particular to mean a master stamp. Soft stamps and micro- and/or nanostructures can thus be produced efficiently and cost-effectively with the production process, in particular by a selection of suitable process parameters and technically appropriate production materials. Furthermore, a deformation of the structured stamp, in particular of the embossing structure of the structured stamp, can be prevented by a suitable selection of the structured stamp and uniform and reproducible embossing can take place.

In another advantageous embodiment of the invention, provision is made such that the embossing material is structured without pressure and/or without contact pressure, in particular by capillary forces. A deformation of the structured stamp can thus advantageously be reduced, in particular prevented. Furthermore, the reproducibility of the embossing process is thus increased and embossing defects can be prevented. In addition, the method is more efficient and more cost-effective. The advantageous production of the structures without an external pressing force can advantageously improve the material properties, such as for example strength values or surface properties, of the embossing material after the curing. In addition, the substrate can advantageously be held after the detachment. The advantage of the method is also used in the production of the micro- and/or nanostructures, in that the smaller the sizes of the structures, the more strongly the capillary forces act. Accordingly, the embossing can be carried out without mechanical pressure, wherein the embossing material is advantageously received by the structures and can thus be adapted particularly well to the structures. Advantageously, when the contacting of the embossing material and the structured stamp takes place, only touching or wetting of the structured stamp, in particular of an embossing structure surface, is required.

In another advantageous embodiment of the invention, provision is made such that the substrate with the embossing material is fixed on the substrate accommodating device by means of a controllable fixing element arranged in the substrate accommodating device, in particular by vacuums and/or underpressure and/or the fixing is cancelled by the at least one controllable fixing element, in particular by switching off the underpressure and/or by generating an overpressure. The at least one fixing element can advantageously fix the substrate on the substrate accommodating device, in particular fix it at specific points. Fixing elements can in particular be vacuum tracks, which are arbitrarily arranged or set into the substrate accommodating device surface, in particular in a circular or spiral shape. The fixing elements can preferably generate an overpressure and/or underpressure. The forces resulting therefrom can be introduced in particular arbitrarily on the substrate, in particular on the side of the substrate facing the substrate accommodating device. In particular, a curvature of the substrate, for example, can thus be produced. The substrate is fixed for example at the edge of the substrate accommodating device by means of an underpressure and an overpressure is generated by means of other fixing elements, wherein the substrate is advantageously raised in particular in the centre. In this way, the contact point can be adjusted in particular during the contacting. In addition, the at least one fixing element can advantageously prevent embossing defects, in particular gas inclusions, by means of a technically expedient and controlled partial fixing or cancelling of the fixing. During the cancelling of the fixing, the fixing elements can also release the substrate in a specific sequence individually and/or in groups. The production of the structures can thus be advantageously initiated, in particular initiated in specific areas. The fixing elements are preferably constituted such that a cancelling of the substrate with the cured embossing material from the structured stamp can be assisted by the fixing elements. An embossing process can advantageously be initiated by the fixing elements. During a release or freeing of the substrate, the capillary forces in particular can advantageously act on the embossing material and/or the substrate.

By means of the fixing elements, a careful and uniform production of the structures is in particular enabled. In addition, the removal of the substrate can also be carried out in a particularly careful and advantageous manner. The substrate accommodating device and the substrate preferably have the shape of a wafer.

In another advantageous embodiment of the invention, provision is made such that the fixing of the substrate and the at least partial cancelling of the fixing of the substrate is controlled, in particular by controlling the at least one controllable fixing element, so that the structuring of the embossing material and/or the release or the detachment of the substrate after the contacting of the structured stamp with the embossing material takes place at a specific time. The at least one fixing element is preferably controlled by a control unit and thus advantageously has an influence on the time of the cancelling of the fixing of the substrate and therefore an influence on the detachment or the time or the release of the substrate. Provision can in particular be made such that the cancelling of the fixing is started at different points by a plurality of controllable fixing elements. The time and the place for the cancelling of the fixing can in particular thus be advantageously controlled. The control unit controls the at least one fixing element preferably depending on values, in particular values provided by sensors.

In another advantageous embodiment of the invention, provision is made such that the structured stamp is constituted in such a way that, after the at least partial cancelling of the fixing, the embossing material and/or the substrate are adapted to or drawn towards the structured stamp in a conformal manner without external pressure, in particular by capillary forces. The structured stamp, in particular the embossing structure of the structured stamp, is constituted in such a way that the structures are advantageously transferred to the embossing material, in particular by capillary forces. The contact surfaces of the structured stamp in particular, which touch the embossing material during the contacting, are constituted such that uniform contacting in particular over the entire area is possible. Advantageously, the structures or recesses and/or projections of the embossing structures of the structured stamp are arranged such that the structuring can take place without pressure. The embossing structures to be transferred are in particular constituted such that, after cancelling of the fixing, the substrate can be adapted conformal with the structures. Advantageously, the structured stamp is also designed for an advantageously easy removal. In particular, the structured stamp or the embossing structure can be used repeatedly. The production process can thus be carried out efficiently and repeatedly on successive occasions with the use of the same structured stamp.

In another advantageous embodiment of the invention, provision is made such that the substrate is held by the embossing material, in particular by capillary forces and/or surface tensions, after the contacting and/or after the at least partial cancelling of the fixing. The substrate thus adheres at least partially after the cancelling of the fixing due to the embossing material on the structured stamp. In particular due to the capillary forces acting on the embossing material, a detachment of the substrate from the substrate accommodating device can occur. As a result of the release of the substrate or as a result of the cancelling of the fixing, the substrate continues to be held, wherein the substrate can advantageously be adapted to the structured stamp. In particular, the substrate can advantageously be adapted freely and uniformly to the embossing structure. In addition, irregularities can thus be compensated for. Any gas inclusions present can in particular escape. Advantageously, the quality of the embossing process is thus raised.

In another advantageous embodiment of the invention, provision is made such that the micro- and/or nanostructures are produced above one another in a plurality of layers and/or beside one another in a step-and-repeat process. A multilayer build-up is carried out in particular repeatedly up until there is no longer the minimum required flexibility of the substrate. The process can thus be carried out more efficiently and more cost-effectively. Furthermore, different layers can be produced above one another. In addition, a plurality of functional structures can be produced over a large area or beside one another in a constant embossing process. The most diverse products can thus be efficiently produced with the method, in particular structured films. In particular, it is advantageous that the structured stamp can be used repeatedly, because without a contact pressure the resistance of the structured stamp is increased or the structured stamp can be used over a plurality of embossing steps.

In another advantageous embodiment of the invention, provision is made such that the thickness of the substrate lies between 1 µm and 2000 µm, preferably between 10 µm and 750 µm, more preferably between 100 µm and 500 µm. The flexibility of the substrate can be increased through the use of thinner substrates. The substrate can thus be adapted still better to the embossing structure and can compensate for irregularities. Furthermore, a larger number of layers can be produced above one another, since the required flexibility is provided over more embossing steps.

In another advantageous embodiment of the invention, provision is made such that the viscosity of the embossing material amounts to less than 100,000 cP, preferably less than 10,000 cP, more preferably less than 1000 cP, most preferably less than 500 cP. Through the use of an embossing material with a lower cP value, in particular the holding of the substrate, the effect of the capillary forces and the conformal adaptation to the embossing structures of the substrate and/or embossing material can be improved. Furthermore, a low cP value is advantageous for the compensation of irregularities. In addition, the flexibility of the substrate is utilised in the optimum manner and a raised embossing quality is thus achieved. By means of a suitable viscosity of the embossing material, the embossing behaviour of the embossing material and the holding of the substrate in particular can advantageously be adjusted.

In another advantageous embodiment of the invention, provision is made such that the structured stamp comprises an embossing structure and/or is coated with an embossing structure. The embossing stamp can thus itself comprise the embossing structure or be coated with an embossing structure, in particular individually adapted to the embossing process. The embossing behaviour can thus advantageously be adjusted. In particular, the production of the structures can be adjusted individually to the process by different embossing coatings. Different embossing structures can be transferred for example with an embossing stamp, in particular in a step-and-repeat process.

In another advantageous embodiment of the invention, provision is made such that the device for producing the micro- and/or nanostructures can carry out in particular the previously described process, wherein a substrate with an embossing material can be fixed on a substrate accommodating device, and wherein a structured stamp can be contacted with the embossing material, and wherein the fixing of the substrate can be at least partially cancelled, and wherein the embossing material can be cured, and wherein the embossing material can be removed from the structured stamp. The device can advantageously produce the micro- and/or nanostructures, in particular without an additional pressing force. The quality of the embossing process is thus raised.

In another advantageous embodiment of the invention, provision is made such that the device further comprises: One or more sensors for the measurement of pressure, distances and/or temperatures, and/or one or more actuators for the adjustment of the stamp accommodating device and/or the substrate accommodating device and a control unit, wherein the control unit controls the at least one fixing element and/or the at least one actuator, in particular depending on a value measured by the at least one sensor, wherein a relative movement of the structured stamp with respect to the substrate with the embossing material, in particular the creation or the reduction of a spacing between the structured stamp and the substrate, can be carried out in such a way that contacting can be carried out, in particular without pressure. Provision is in particular made such that the control unit, on the basis of the sensor values, brings about a contact of the structured stamp surface, in particular the embossing structure surface, by triggering the actuators. Contacting without an additional contact pressure can thus advantageously take place. The actuators for creating the spacing can be arranged on or can engage with any components, preferably with the substrate accommodating device and/or with the stamp accommodating device. It can thus advantageously be ensured that the production of the micro- and/or nanostructures is carried out in the optimum manner. In addition, the control unit is configured in such a way that the fixing of the substrate by the fixing elements is carried out advantageously during the detachment and removal from the moulding position, in particular depending on the sensor values. This has the advantage that the process quality is raised and embossing defects can be avoided.

In a less preferred embodiment of the invention, provision is made such that the control unit of the device brings about contacting with additional contact pressure by triggering the actuators, which can be controlled separately. The resultant force for the transfer of the stamp structure orthogonal to the substrate contact surface is <500 N. The structured stamp can for example be over the entire area in the wafer format or alternatively in particular in a step-and-repeat process can have a defined area, which is smaller than the substrate to be embossed. The resultant pressure for the transfer of the stamp structure orthogonal to the substrate contact surface is in particular less than 50 N/mm2, preferably less than 25 N/mm2, more preferably less than 10 N/mm2, most preferably less than 1 N/mm2, with utmost preference less than 0.1 N/mm2.

In the present invention, the substrate is very thin compared to the substrates described in the prior art. Either no carrier substrate is used for the stabilisation of the substrate (or product substrate) or the carrier substrate or the carrier plate or carrier film is itself thin and flexible. The substrate to be embossed is thus very flexible, in particular mounted flexibly.

The micro- and/or nanoimprint process is carried out with a structured stamp, preferably an elastomer structured stamp, preferably with a structured stamp in the wafer format. The structured stamp is brought into contact with a substrate preferably pre-lacquered over the entire area, in particular brought into contact with the embossing material provided on the substrate.

The structured stamp and the substrate are each fixed on an accommodating device of an imprint apparatus. The fixing of the substrate on the substrate accommodating device preferably takes place with the aid of a vacuum or underpressure. Following an alignment, the contact surfaces of the substrate and the structured stamp make contact over the full area. As soon as the structured stamp is in contact with the substrate, the fixing is released from the substrate coated with embossing material, in particular by interruption of the vacuum. Through the effect of capillary forces, the thin, flexible substrate is drawn in a conformal manner towards the structured stamp. As a result of the flexibility of the substrate and the gained degree of freedom through the detachment of the substrate, the substrate can be deformed and adapted to the structured stamp. Uniform contacting is thus enabled during the embossing.

The substrate and the substrate stamp are held together by capillary forces with the embossing material lying in between. For this purpose, at least the substrate, preferably the substrate and the structured stamp, must have a high degree of flexibility. On account of the viscosity of the embossing material, the intermediate spaces of the structured stamp are also completely filled therewith due to the capillary effect.

Due to the use of the capillary forces, no additional external pressure and/or no contact pressure of the substrate and the structured stamp is required during the embossing or production of the micro- and/or nanostructures. A deformation of the structures of the structured stamp caused by contact pressure is thus avoided, in particular prevented.

Capillary forces are understood in particular to mean the forces which arise due to surface tensions and/or interface tensions. The capillary ascension and the capillary depression can be used in particular during the production. Further forces can also occur in production, for example forces of adhesion and gravitational forces. Due to the small micro- and/or nanostructures, use can advantageously be made of the fact that the smaller the sizes of the structures, the greater the effect of the capillary force or the capillary pressure.

The flexibility of the substrate makes it possible to compensate for irregularities of the structured stamp and/or of the substrate and also to prevent further embossing defects, for example those caused by air inclusions, as a result of which the quality of the embossing process is very high.

Through the use of the capillary forces, no additional, external pressure and/or no contact pressure of the substrate and the stamp, in particular, is needed during the embossing. The device and the embossing process are thus advantageously simplified, since no actuator device is needed for the transfer of force.

As a result of the flexibility of the substrate and the gained degree of freedom due to the detachment of the substrate after the contacting without external pressure, the substrate can be deformed and can in particular adapt to the structured stamp.

A uniform, conformal contacting during the embossing is possible. Very good imprints are thus obtained without the presence of embossing gaps, which would arise due to zones not contacted or poorly contacted during the embossing and subsequent curing.

The proposed invention prevents a deformation of the micro- and/or nanostructures of the structured stamp caused by contact pressure.

The viscosity of the embossing material preferably lies between 1 and 100,000 cP, so that a broad selection of embossing materials or embossing lacquers and a process optimisation with optimum combination of the substrate, the stamp material and the embossing material is possible.

The embossing material in particular does not have to have a low viscosity. In particular, a solvent atmosphere is not required.

The contacting and embossing can be carried out in particular at ambient pressure, for example under an air or an inert gas atmosphere. Other, in particular controllable process pressures, are also conceivable.

The contacting and embossing can be carried out in particular at room temperature and at raised temperatures.

The described method advantageously enables a high throughput and can in particular reduce unit costs per produced unit.

The embossing of periodic and non-periodic micro- and nanostructures is possible.

A precise alignment is advantageously not absolutely necessary. The degree of alignment of the substrate and the structured stamp before the contacting, for example only roughly or finely with highly precise alignment systems, can be varied specific to each case.

Different types of flexible substrates can be used in the described method.

The embossing or production can be carried out with smooth and/or with rough surfaces. The roughness can be varied specific to the case.

The embossing or production can be carried out in particular with flat and/or with curved stamp surfaces. As a result of the flexibility of the substrate and the mobility due to the detachment of the substrate after the contacting without external pressure, the substrate can be deformed and adapted to the stamp.

Both conductive and non-conductive UV-curable embossing materials can be used.

Both conductive and non-conductive thermally curable embossing materials can be used.

With the proposed invention, multilayer embossing processes can be carried out. A first already embossed and cured layer of a flexible substrate can again be coated in a further step with a second embossing material, which is then embossed and cured again. The production of further layers is conceivable in particular as long as a sufficient substrate flexibility is still present. Furthermore, a plurality of embossing steps can be carried out in parallel and/or beside on another, and combined with the substrates previously produced in each case.

In the described method, the thickness of the embossing material on the substrate can be varied as required, so that both thin and also thicker layers of embossing material can be embossed or produced.

With the proposed invention, both working stamps can be produced for imprint lithography and also generally different types of embossing materials, which can be cured thermally or by means of electromagnetic radiation, in particular UV radiation, can be embossed for the structuring of substrates. UV-curable embossing materials are preferably used.

The proposed invention can be used in particular for the production of the following products:
  1D-, 2D-, and/or 3D diffractive optical elements (DOE),
  microfluidic components,
  lenses and lens systems,
  Fresnel lenses,
  biomedicinal elements,
  polarisers,
  nanostructured electrodes,
  IR wave conductors,
  angular optics for virtual reality applications,
  fibre optic connections,
  working stamps for imprint lithography and others.

Capillary effects are caused in particular by the surface tension of liquids themselves or the interface tension between liquids and the solid surface. The capillary forces appear in the interactions between solid surfaces and liquids or between solid bodies in the presence of particularly small liquid quantities. The cohesion between liquid molecules and the adhesion between liquid molecules and the surfaces of the substrate and the substrate stamp due to the coating with an embossing material lying in between contribute to the fact that both surfaces remain in contact after contacting in particular without the action of an external force. Thin, flexible substrates are advantageously used, so that the capillary forces have a correspondingly strong effect and the substrate is drawn in a conformal manner towards the structured stamp.

A further aspect is the detachment of the thin coated substrate as soon as the structured stamp is in contact with the substrate. The fixing of the substrate coated with the embossing material is released in particular by the release of the fixing, for example by interruption of the vacuum.

Due to the effect of capillary forces, the thin, flexible substrate remains connected to the structured stamp in a conformal manner.

As a result of the flexibility of the substrate and the gained degree of freedom due to the detachment of the substrate from the substrate accommodating device, the substrate can be deformed and adapted to the structured stamp. Uniform contacting is thus enabled during the embossing.

As a result of the conformal contact, the intermediate spaces of the structured stamp are in particular completely filled on account of the viscosity of the embossing material and also due to the capillary effect. The capillary pressure is in particular dependent on the size of the structures.

The smaller the structures, the greater the capillary pressure. A high-resolution structuring in the lower nm range ($\leq 50$ nm) is possible, since the capillary pressure is greatest in this range.

Furthermore, embossing defects are advantageously prevented, which would arise due to the use of external contact pressure during the embossing process.

Method

The substrate is very thin compared to substrates in the prior art. Either no carrier substrate is used for the stabilisation of the substrate (or product substrate) or the carrier substrate or carrier plate or carrier film is itself thin and flexible. The substrate to be embossed is therefore very flexible.

The micro- and/or nanoimprint process is carried out with a structured stamp, preferably an elastomer stamp, in particular in the wafer format. The structured stamp is brought into contact with a substrate preferably pre-lacquered over the entire area.

The structured stamp and the substrate are in particular each fixed on an accommodating device of an imprint apparatus. The fixing of the substrate on the substrate accommodating device preferably takes place with the aid of a vacuum or an underpressure. Following an alignment, the contact surfaces of the substrate and the structured stamp make contact over the entire area. As soon as the structured stamp is in contact with the substrate, the fixing is released from the substrate coated with the embossing material in particular by interruption of the vacuum. Release processes can act over the entire area or along a predefined course. The fixing elements are correspondingly controlled.

If, after the contacting has taken place, the substrate is detached from the accommodating device over the entire area, the substrate continues to adhere to the structured stamp due to the capillary effects (capillary force) acting through the embossing material present between the substrate and the structured stamp. According to the invention, an additional external pressing force is not required for successful embossing or production.

Due to the action of capillary forces, the thin, flexible substrate is drawn towards the stamp in a conformal manner. As a result of the flexibility of the substrate and the gained degree of freedom due to the detachment of the substrate, the substrate can be deformed and adapted to the stamp. Uniform contacting during the embossing is thus enabled.

The substrate and the structured stamp are held together with the embossing material lying in between due to capillary forces. At least the substrate must have a high degree of flexibility for this. On account of the viscosity of the embossing material, the intermediate spaces of the structured stamp are in particular completely filled therewith due to the capillary effect.

The proposed invention thus prevents a deformation of the structures of the structured stamp caused by contact pressure. Furthermore, the flexibility of the substrate makes it possible for irregularities of the stamp and/or of the substrate to be compensated for and also to prevent further embossing defects, for example those which are caused by air inclusions, as a result of which the quality of the embossing process is very high.

During the adaptation and deformation of the thin substrate to the structured stamp, the gas, in particular air or inert gas, present between the substrate and the structured stamp can be pushed out, so that embossing can take place without gas inclusions. An inclusion of air or other gases can be prevented in particular by a regulated release by the fixing elements, which hold or fix the substrate. An advantageous detachment of the substrate can take place in particular by a single release at the fixing elements, in particular a concentrated release along the wafer surface.

After the curing of the embossing material, the substrate can if need be again be fixed on the accommodating device with a vacuum, so that the removal from the moulding position can take place.

The method according to the invention for the embossing of thin, flexible substrates with a structured stamp for the micro- and/or nanostructuring comprises in particular the following steps, in particular in the following sequence:
a) fixing of the substrate and the structured stamp on the corresponding accommodating devices;
b) application of the embossing material on the substrate;
c) rough and/or fine adjustment of the substrate and the structured stamp;
d) starting of the embossing process by contacting, in particular by a relative movement of the substrate accommodating device and/or the stamp accommodating device, of the substrate with embossing material and the structured stamp, so that the substrate is drawn towards the structured stamp by capillary effects and a conformal contact arises,
e) release of the fixing from the flexible substrate on the substrate accommodating device as soon as the contacting has taken place. As a result of the degree of freedom thus gained, the flexible substrate can be deformed and adapted to the structured stamp.
f) curing of the embossing material;
g) renewed fixing of the embossed substrate on the substrate accommodating device and removal of the structured stamp and the substrate from the moulding position.

The embossing is preferably initiated after contacting of the contact surfaces of the substrate and the structured stamp with the embossing material and therefore after the application of the capillary forces in particular through the detachment of the substrate.

After the release, the thin substrate is in particular no longer subject to any fixing to the accommodating device and can thus be adapted to the structured stamp.

Contacting preferably describes contacting over the entire area. Alternatively, contacting can take place from the edge or from the middle. For pointwise contacting, curving of the structured stamp and/or the substrate is carried out by means of curving means in a further embodiment according to the invention. The contacting can advantageously be assisted of the by, in particular, controlled fixing elements.

In another embodiment, a step-and-repeat process is carried out. The structured stamp is used in the step-and-repeat process in such a way that a repeating structure is applied at the circumference for example of an embossing roller. Provision is made such that the device comprises curing means for the curing of the embossed substrate, in particular section by section, preferably with sections corresponding with the step-and-repeat process, in particular corresponding to a stamp area of the structured stamp.

Substrate, Structured Stamp and Embossing Material

Particularly preferably, the substrate and/or the substrate stamp is flexible in order to enable a conformal contact over the entire substrate surface or structured stamp surface. In a preferred embodiment, the substrate is very thin, so that an advantageous flexibility is provided. Either no carrier substrate is used for the stabilisation of the substrate or the carrier substrate or the carrier plate or carrier film is also itself thin and flexible. The substrate to be embossed is thus very flexible. The thin substrate is fixed on an accommodating device, so that the handling is facilitated.

The substrate can have any shape, preferably round, rectangular or square, more preferably in the wafer format. The diameter of the substrates amounts to more than 2 inches, preferably more than 4 inches, more preferably more than 6 inches, still more preferably more than 8 inches, most preferably more than 12 inches. A substrate is understood in particular to mean a wafer.

The thickness of the substrate lies in particular between 1 μm and 2000 μm, preferably between 10 μm and 750 μm, more preferably between 100 μm and 500 μm.

The structured stamp can have any shape, preferably round, rectangular or square, more preferably in the wafer format. The diameter of the structured stamp preferably largely agrees with the diameter of the substrates.

For the implementation of soft lithography processes, elastomer structured stamps are used as standard, preferably UV-transparent polymer stamps.

Transparent elastomer structured stamps for UV-NIL are produced for example from the following polymers: silicones such as polydimethylsiloxanes (PDMS), polyorganosilsesquioxanes (POSS), perfluorinated polyesters (PFPE), polytetrafluoroethylene (PTFE), polyvinyl alcohol (PVA), polyvinylchloride (PVC), ethylene tetrafluoroethylene, and so forth. Combinations of a plurality of materials and a plurality of layer systems are possible.

The structured stamp is preferably fixed on a carrier or a backplane, in particular a plate, most preferably a glass carrier. Further conceivable materials for the carrier are polymers and/or metals. The carrier can in particular also be a stamp carrier substrate.

At its embossing side, the structured stamp has in particular a plurality of embossing structures, preferably distributed over the entire embossing area of the embossing side, in particular arranged regularly. The dimensions of the individual structures of the embossing stamp preferably lie in the micrometre- and/or in the nanometre range. The dimensions of the individual structures are in particular less than 20 µm. The dimensions of the individual structures lie in particular between 0.1 nm and 20 µm, preferably between 1 nm and 10 µm, more preferably between 1 nm and 5 µm, still more preferably between 1 nm and 2 µm.

The structured stamp can comprise a positive and/or negative profiling located on the side facing the substrate surface to be treated. The structured stamp can also comprise embossing structures with different dimensions.

In an alternative embodiment, the structured stamp is made of hard UV-transparent materials such as for example glass, quartz, or silicon dioxide. In this embodiment, the substrate in particular must have the required thin layer thickness and flexibility. In a further embodiment, the structured stamp is made of hard materials such as for example silicon, semiconductor materials, or metals such as Ni or Ti.

The embossing material is cured in particular by chemical and/or physical processes. In particular, the embossing material is cured by electromagnetic radiation and/or by temperature.

The curing preferably takes place by electromagnetic radiation, particularly preferably by UV-radiation. In this case, the structured stamp is preferably transparent for the required electromagnetic radiation, if the embossing material is to be cured from the structured stamp side.

At the side of the structured stamp facing away from the embossing structures, a corresponding radiation source is preferably arranged. The structured stamp is thus in particular transparent in a wavelength range between 5000 nm and 10 nm, preferably between 1000 nm and 100 nm, more preferably between 700 nm and 200 nm, most preferably between 500 nm and 250 nm.

The optical transparency of the structured stamp is greater than 0.01%, preferably greater than 20%, more preferably greater than 50%, most preferably greater than 80%, with utmost preference greater than 95%.

The viscosity of the embossing material preferably lies between 1 and 100,000 cP, so that a broad selection of embossing materials/embossing lacquers and a process optimisation with optimum combination of the substrate, the stamp material and the embossing material is possible. The viscosity is in particular less than 100,000 cP, preferably less than 10,000 cP, more preferably less than 1000 cP, most preferably less than 500 cP.

The embossing material is coated in particular over the entire area or is applied as drops at defined distances on the substrate or the structured stamp. The embossing material is preferably applied on the substrate. The application of the embossing material can take place before or after the fixing of the substrate. According to the invention, areas can also be defined with more embossing material or more drops, depending on the topography of the structured stamp or depending on the size of the structures. The application of the embossing material can be carried out for example with a metering device with a nozzle, which can be arranged between the structured stamp and the substrate.

In another embodiment, the invention can be used in combination with the established industrial coating processes, such as for example the spin-coating process. The coating can be carried out separate from the embossing process in a separate module. The coating of the substrate is thus rapid, defect-free, over the full area, free from particles and standardised. In particular, throughput advantages and cost reductions thus result.

Device

The invention relates in particular to the described method and a device for the transfer of a structure, in particular a micro- or a nanostructure, from a preferably UV-transparent structured stamp onto a flat side of a substrate, in particular coated over the full area, with a substrate holder accommodating the substrate on a substrate accommodating surface and a structured surface of the structured stamp, which can be aligned in parallel with the substrate contact surface and can be arranged lying opposite the latter.

The device can preferably be installed in a process chamber, which can be hermetically sealed with respect to the surroundings. An evacuation of the process chamber and/or a ventilation of the process chamber with an arbitrary gas or gas mixture is thus enabled. The process chamber can be evacuated to pressures less than 1 bar, preferably less than 10 mbar, more preferably less than 5 mbar.

In a preferred embodiment, the method according to the invention takes place at ambient pressure, for example under an air or an inert gas atmosphere.

The process chamber can in particular be flushed with any gas or gas mixture. This is advantageous especially when the embossing is not intended to take place under a vacuum. A possible, but not the only, reason for dispensing with a vacuum would be a high volatility of the embossing material at low ambient pressure. The slight volatility, which is characterised by a high vapour pressure, can contribute decisively to the contamination of the process chamber.

The gas employed should then have as little interaction is possible with the embossing material. Particularly preferably, the flushing would be with an inert gas, which does not interact with the embossing material.

The contacting and the embossing can be carried out both at room temperature as well as at raised temperatures. The equipment according to the invention has appropriate means for the temperature regulation and heating.

In another embodiment, the contacting of the substrate and the structured stamp is particularly critical, since defects can arise here and a reproducible adjustment accuracy cannot be met. The device can be used in combination with alignment for highly precise, adjusted embossing, amongst other things, of different layers above one another for example with the aid of the SVA (Smart® View Alignment) method. In the critical step of the contacting of the aligned contact surfaces of the substrate and the (nano)structured stamp, an ever more exact adjustment accuracy or offset of less than 100 µm is desired, in particular less than 10 µm, preferably less than 1 µm, most preferably less than 100 nm, with utmost preference less than 10 nm.

The substrate and the structured stamp are brought together in an aligned manner in the described device, so that the approach and adjustment for a micro- and/or nano-imprint embossing process are carried out in a controlled manner. The device preferably comprises a system for a contactless wedge error compensation between the stamp aligned parallel and the substrate according to patent specification EP2612109B1, wherein approach means are used for the approach of a first surface towards a second surface in a translation direction (T) transversely to the accommodating surfaces of the accommodating devices until in the final position.

In another embodiment, a rough alignment is sufficient. An exact alignment is in particular not necessary, since the thin substrate, due to its flexibility and the given mobility due to the detachment from the substrate holder, can be adapted to the structured stamp.

The substrate and the structured stamp are fixed on an accommodating device or chuck. Decisive for the accommodating device is in particular a flat accommodating surface or holding surface for the holding and fixing. The accommodating device for the substrate and the structured stamp is preferably a vacuum sample holder. The use of an electrostatic sample holder, a sample holder with magnetic or electrical fixing, a sample holder with a variable adhesion property or with suitable mechanical clamping would also be conceivable.

In a preferred embodiment, the substrate and the structured stamp are fixed by an underpressure or vacuum on a flat hardened surface, in which vacuum tracks are milled. The substrate accommodating device has vacuum tracks on the entire surface or on outer zones of the surface. The underpressure channel preferably runs concentrically, in particular in a circular shape, to a centre Z of the accommodating device, in particular around the entire circumference. A particularly uniform fixing is thus advantageously achieved.

The accommodating devices, in particular the substrate accommodating device, preferably have vacuum tracks only on outer zones of the surface, so that the substrate is fixed only partially, in particular at the edge. In particular, there is the possibility of releasing the substrate and/or the structured stamp completely from the accommodating device. For this purpose, the fixing, in particular the holding vacuum, of the accommodating device is deactivated. The fixing elements, which are acted upon with an underpressure for the fixing, can also be acted upon with an overpressure for the detachment of the substrate. According to an advantageous embodiment, the accommodating device can comprise a second vacuum zone, in order to ensure fixing of the substrate over the entire area after the embossing and curing process.

If the fixing elements are provided as vacuum elements, they can generate a pressure of less than 1 bar, preferably less than 0.1 mbar, still more preferably less than 0.01 mbar, most preferably less than 0.001 mbar, with utmost preference less than 0.0001 mbar. The fixing elements can in particular be controlled individually or in groups.

An accommodating device according to the invention can alternatively or additionally comprise sensors, with the aid of which physical and/or chemical properties between the fixed substrate and of the accommodating device can be measured. These sensors are for example temperature sensors, pressure sensors or distance sensors. It is also conceivable for a plurality of different types of sensor to be incorporated. Furthermore, the sensors can also be arranged on other parts of the device. For example, a distance sensor or a pressure sensor can be arranged between the accommodating devices. In particular, the distance and/or an acting force between the substrate with the embossing material and the stamp or the stamp structure can be measured.

Furthermore, the contour of the accommodating surface can if required be set back with respect to the accommodating plane of the accommodating surface, so that depressions are formed, which reduce the size of the accommodating surface or change it. Substrates (product substrates) structured or processed on both sides can thus also be used.

In a further embodiment, the accommodating devices are constituted such that the substrate and/or the structured stamp can be heat-treated over the entire area or in sections. The accommodating devices can be heat-treated in a temperature range between −100° C. and 500° C., preferably between −50° C. and 450° C., still more preferably between −25° C. and 400° C., most preferably between 0° C. and 350° C.

The embodiment of the substrate accommodating device according to the invention also enables the handling of substrates with a liquid layer thereon. The liquid layer is in particular a liquid embossing lacquer or embossing material which is located in the interface during the contacting.

The embossing material is in particular coated over the entire area or is applied as drops at defined distances on the substrate or the structured stamp. The embossing material is preferably applied on the substrate. Areas can also be defined with more embossing material or more drops, depending on the topography of the substrate and/or of the structured stamp. The application of the embossing material can be carried out in particular with a metering device with a nozzle, which can be arranged between the structured stamp and the substrate.

In another embodiment, the method can be used in combination with the established industrial coating processes, such as for example the spin-coating process. The coating can be carried out separate from the embossing process in a separate module. The coating of the substrate can thus be carried out rapidly, defect-free, over the full area, free from particles and standardised. In particular, this is accompanied by throughput advantages.

In another embodiment, the accommodating devices comprise, preferably in the centre, a device for the bending of the, in particular, only partially fixed structured stamp and/or substrate. The device for the bending is referred to as a curving element. The curving element is in particular a nozzle, through which a fluid, preferably in a gas, can exit, in order to generate an overpressure for example between the structured stamp and the accommodating device, which curves the structured stamp. Due to the fact that the structured stamp is fixed by vacuum with the accommodating device preferably at the circumference, a curvature of the structured stamp results.

According to the invention, the embossing is initiated after contacting, preferably contacting over the entire area of the contact surfaces of the substrate and the structured stamp with the embossing material, and therefore after the onset of the capillary forces in particular due to the detachment of the substrate.

BRIEF DESCRIPTION OF THE DRAWINGS

Further advantages, features and details of the invention emerge from the following description of preferred examples of embodiment and with the aid of the drawings. In the drawings, schematically.

DETAILED DESCRIPTION OF THE INVENTION

Identical components or components with the same function are denoted with the same reference numbers in the figures. The figures are not represented true to scale in order to improve the representation.

Figure 1A:
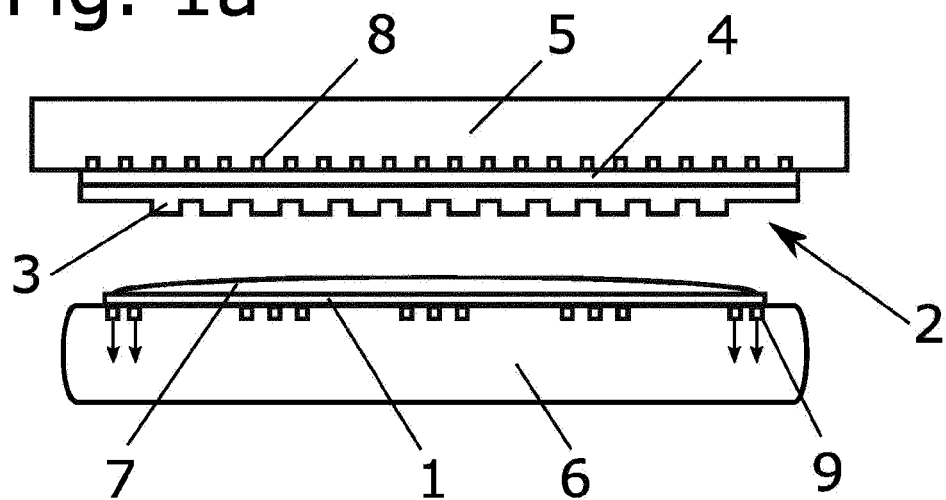
FIG. 1a shows a cross-sectional view of the device in a first embodiment of the method.

FIG. 1a shows a cross-sectional view of the device in a first embodiment. FIG. 1a shows in particular accommodating devices 5 and 6 of a device for accommodating structured stamp 2 and substrate 1. The accommodating surfaces of accommodating devices 5 and 6 are in particular adapted to the dimensions and the circumferential contour of structured stamp 2 and substrate 1.

In a preferred embodiment, structured stamp 2 from FIGS. 1a to 1e is an elastomer soft stamp 2. Elastomer structured stamp 2 enables a conformal, uniform contact over large surfaces. In order to ensure good separation of structured stamp 2 and substrate 1, the stamp surface has a surface energy which is as low as possible.

Elastomer structured stamp 2 is supported if required by a carrier or stamp carrier substrate 4. In another embodiment, glass carrier substrates with different thicknesses are used. As a result of using a stamp carrier substrate 4, elastomer structured stamp 2 at least partially loses its flexibility. On the other hand, the flexibility of structured stamp 2 can be controlled by the selection of carrier 4. In an alternative embodiment, carrier 4 can be a plate. In a third embodiment, no carrier 4 is required. The structure of structured stamp 2 is not limited to the embodiment from FIGS. 1a to 1e.

Structures 3, 3' of structured stamp 2 have dimensions in the micrometre and/or in the nanometre range. In a preferred embodiment, the fixing of structured stamp 2 takes place by vacuum or underpressure via vacuum tracks 8 of a vacuum device (not shown). In the example of embodiment according to FIGS. 1a to 1e, the underpressure for the fixing of the structured stamp is applied as a plurality of vacuum tracks 8 running concentrically to one another and covering the accommodating surface of stamp accommodating device 5 for accommodating the structured stamp. In an alternative embodiment, vacuum tracks 8 are located only in the area of a side edge of the accommodating surface of stamp accommodating device 5, in this alternative embodiment, only an outer annular section of the accommodating surface of stamp accommodating device 5 is provided for the fixing of structured stamp 2 by means of vacuum tracks 8.

In a preferred embodiment according to FIGS. 1a to 1e, substrate is very thin compared to substrates in the prior art, so that a flexibility is provided. In this first embodiment, no carrier substrate is used for the stabilisation of substrate 1 or product substrate, Thin substrate 1 is fixed to an accommodating device 6, so that the handling is facilitated. In an alternative embodiment, a carrier (not represented) is used for the stabilisation of thin substrate 1. The carrier can for example be a carrier substrate, a carrier plate or a carrier film. The carrier supports the substrate and prevents bending, but is itself also thin and thus also has a sufficient flexibility. The substrate to be embossed is thus flexible.

In a preferred embodiment, the substrate from FIGS. 1a to 1e is a very thin substrate. The thickness of substrate 1 lies in particular between 1 μm and 2000 μm, preferably between 10 μm and 750 μm, more preferably between 100 μm and 500 μm.

The thickness of structured stamp 2, substrate 1 and embossing material 7 is not represented true to scale in the figures in order to improve the representation.

The accommodating surface of substrate accommodating device 6 from FIG. 1a is preferably at least for the most part adapted to the dimensions of substrate 1. In a preferred embodiment, the fixing of substrate 1 takes place by vacuum or underpressure via vacuum tracks 9 of a vacuum device (not represented).

Figure 1B:
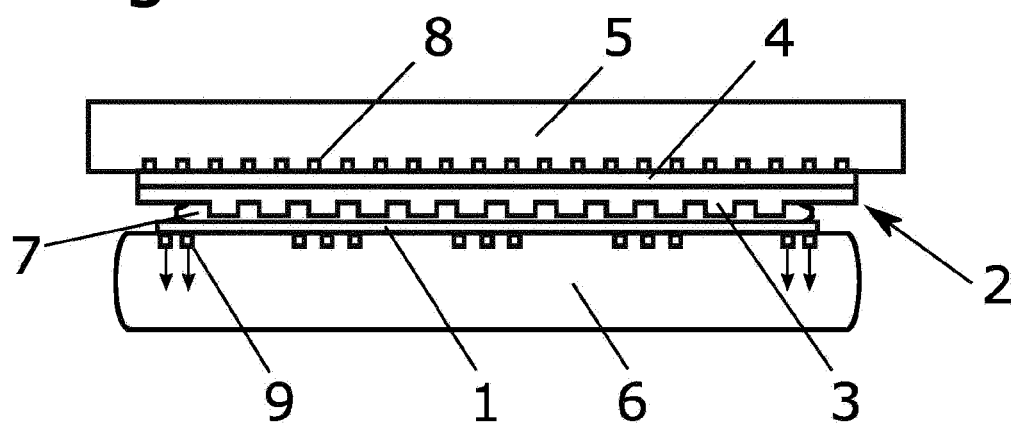
FIG. 1b shows a cross-sectional view of the device in the first embodiment of the method after the approach of the structured stamp and the substrate holder up to an end point without external contact pressure.

In the example of embodiment according to FIGS. 1a to 1e, the underpressure for the fixing of substrate 1 is applied as a plurality of vacuum tracks 9 running concentrically to one another and covering the accommodating surface of substrate accommodating device 6 for accommodating substrate 1. The fixing means are also constituted as in particular separately controllable fixing elements distributed in particular uniformly on the accommodating surfaces and divided into zones. In FIGS. 1a and 1b, only vacuum tracks 9 in the zone of a side edge of the accommodating surface of substrate accommodating device 6 are at first separately controlled and activated (control or activation are represented by arrows). The edge area extends in particular to the half radius, preferably up to a quarter of the radius, of the accommodating surface.

The substrate according to FIG. 1a has already been coated over the full area with an embossing material 7. In a preferred embodiment, the method is used in combination with the established industrial coating processes such as for example the spin-coating process. The application of the layers takes place in particular with spin, spray or inkjet processes as well as dip coating or roll coating processes. The coating can be carried out separately from the embossing process in a separate module.

Figure 2:
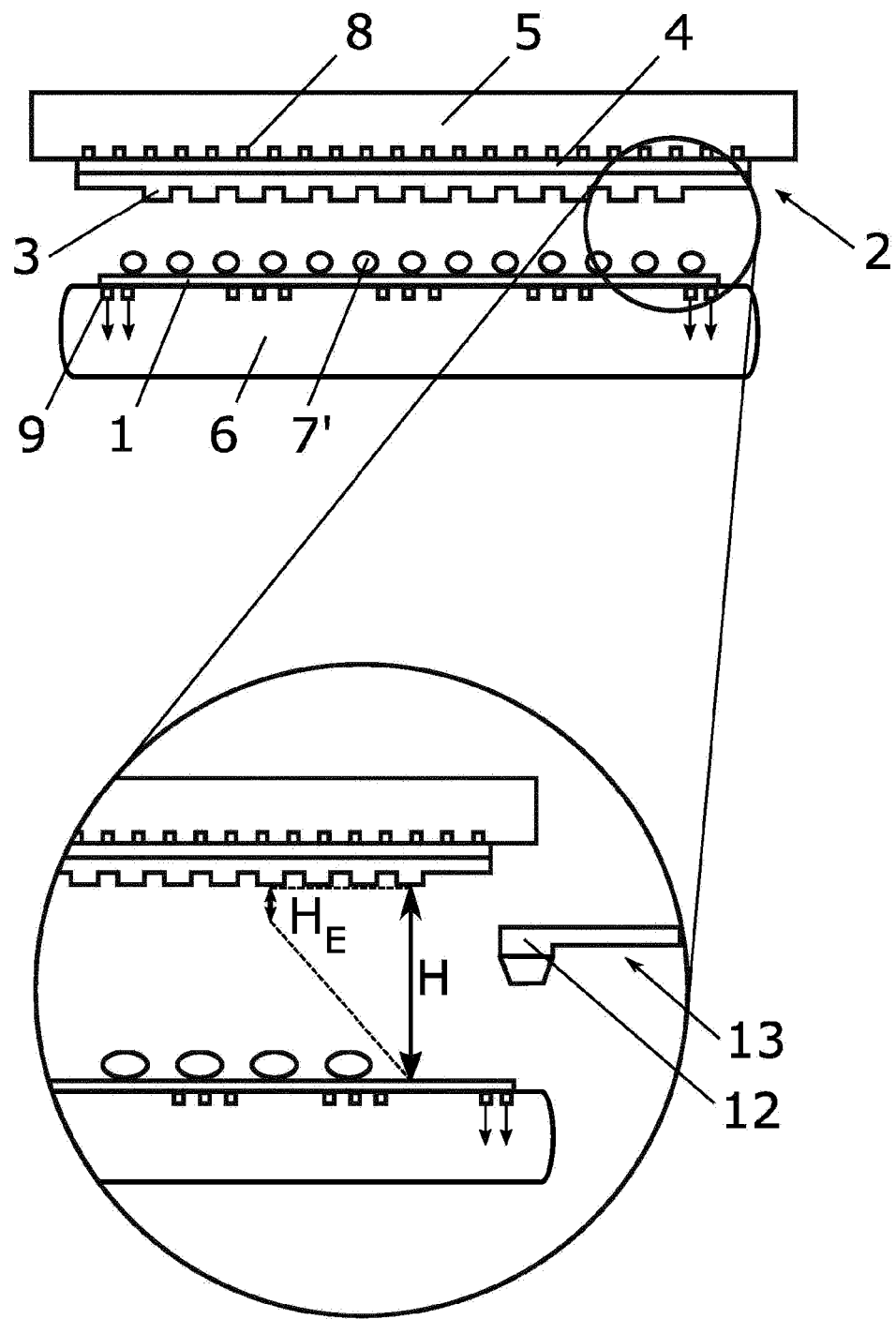
FIG. 2 shows a cross-sectional view of the device in a first embodiment of the method with an enlarged view of the cross-sectional view.

In an alternative embodiment according to FIG. 2, the application of embossing material 7' can be carried out with a metering device 13 with a nozzle 12, which can be arranged between structured stamp 2 and substrate 1. In this embodiment, embossing material 7' is applied as drops at defined distances on substrate 1. The volume of the drops is precisely measured and controlled, so that an intermediate layer thickness of a possible intermediate layer, which remains between the structure depression of the embossed structure and the substrate surface, is adjusted. An intermediate layer thickness as small as possible is preferred. Preferably, the intermediate layer thickness lies between 50 µm and 0.01 nm, more preferably between 10 µm and 0.01 nm, most preferably between 1 µm and 0.01 nm.

In an embodiment, substrate accommodating device 6 also enables the handling of substrates 1 with a liquid layer thereon. The liquid layer is in particular a liquid embossing lacquer or embossing material 7, 7', which is located in the interface during the contacting.

FIG. 1b shows the device in a further process step. Following an alignment, the contact surfaces of substrate 1 and structured stamp 2 are brought closer together and contact is made over the entire area.

In an embodiment according to the invention, an approaching relative movement between structured stamp 2 and substrate 1, takes place. Preferably, only one of accommodating devices 5, 6 is moved. Preferably, only structured stamp 2 is advanced relative to static substrate accommodating device 6.

In the step of contacting structured stamp 2 and substrate 1 according to FIG. 1b, only the fixing means in the edge area of substrate accommodating device 6 are used. As soon as structured stamp 2 is in contact with substrate 1, the fixing is released from substrate 1 coated with embossing material 7, 7' by, interruption of the vacuum. By reducing the underpressure at the accommodating surface, the detachment of substrate 1 can be carried out in a controlled manner. The fixing elements are controlled accordingly. Structured stamp 2 remains unchanged, fixed to stamp accommodating device 5.

Figure 1C:
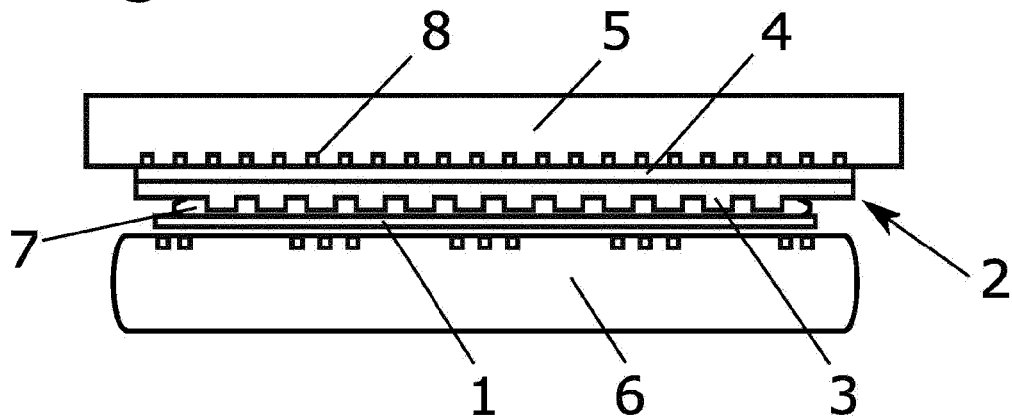
FIG. 1c shows a cross-sectional view of the device in the first embodiment of the method, wherein the substrate is detached from the substrate accommodating device by interruption of the vacuum in the vacuum tracks and adheres in a conformal manner to the structured stamp due to capillary forces.

After the detachment, substrate 1 continues, according to FIG. 1c, to adhere to structured stamp 2 on account of the capillary effects or capillary force acting through embossing material 7, 7' present between substrate 1 and structured stamp 2 and the embossing process is initiated over the entire area. According to the invention, an additional external pressing force is not required for successful embossing or production. According to the invention, accommodating devices 5, 6 are brought closer together only to an extent such that distance H (see FIG. 2) is reduced to a precisely defined distance $H_E$, so that the imprint process is started without an additional external pressing force being used. Final distance $H_E$ is in particular less than 100 µm, preferably less than 10 µm, most preferably less than 500 nm, with utmost preference less than 100 nm. Due to the effect of capillary forces, thin, flexible substrate 1 is drawn in a conformal manner towards structured stamp 2. As a result of the flexibility of substrate 1 and the gained degree of freedom through the detachment of substrate 1, substrate 1 can be deformed and adapted to structured stamp 2. Uniform contacting during the embossing is thus enabled.

FIG. 1c shows the device with, in particular UV-transparent, structured stamp 2 loaded on stamp accommodating device 5, wherein substrate 1 on structured stamp 2 with embossing material 7 lying in between is held together by means of capillary forces. For this purpose, at least substrate 1 must have a high degree of flexibility. On account of the viscosity of embossing material 7, the intermediate spaces of structured stamp 2 are thus completely filled also due to the capillary effect.

In the embodiment according to FIG. 1c, substrate 1 no longer lies on the accommodating surface of substrate accommodating device 6 after the interruption of the fixing to substrate accommodating device 6 and after the effect of the capillary forces. In a second embodiment (not represented) substrate 1 still lies on the accommodating surface of substrate accommodating device 6, without (active) fixing by fixing means and without the effect of external forces. As to whether a contact is still present between substrate 1 and the accommodating surface of substrate accommodating device 6 after release of the substrate fixing by fixing means 9, this depends on a plurality of process parameters such as for example the amount and viscosity of embossing material 7, 7', the size of structures 3, 3' of structured stamp 2, the adjustment of final distance $H_E$, etc.

In an alternative embodiment (not represented), structured stamp 2 is located on the lower accommodating device and substrate 1 on the upper accommodating device. After detachment, substrate 1 continues to adhere to structured stamp 2 due to the capillary force acting through the embossing material present between substrate 1 and structured stamp 2, also caused by the additional force of gravity, and lies on embossing material 7 applied for example as drops at defined distances on structured stamp 2.

In all the embodiments represented, no external pressure, in particular no contact pressure is required, in order to achieve a conformal or seamless contact between structured stamp 2 and substrate 1 with embossing material 7. The devices have the advantage that an actuator device does not have to be used in order to act on stamp 2 and/or substrates 1 with a force serving for the transfer of stamp structure 3 and resulting orthogonal to the substrate contact surface.

The method prevents a deformation of structures 3 of structured stamp 2 caused by contact pressure. And the flexibility of substrate 1 makes it possible to compensate for irregularities of structured stamp 2 and/or substrate 1 and also to prevent further embossing defects, for example ones caused by air inclusions, as a result of which the quality of the embossing process is very high.

Figure 1D:
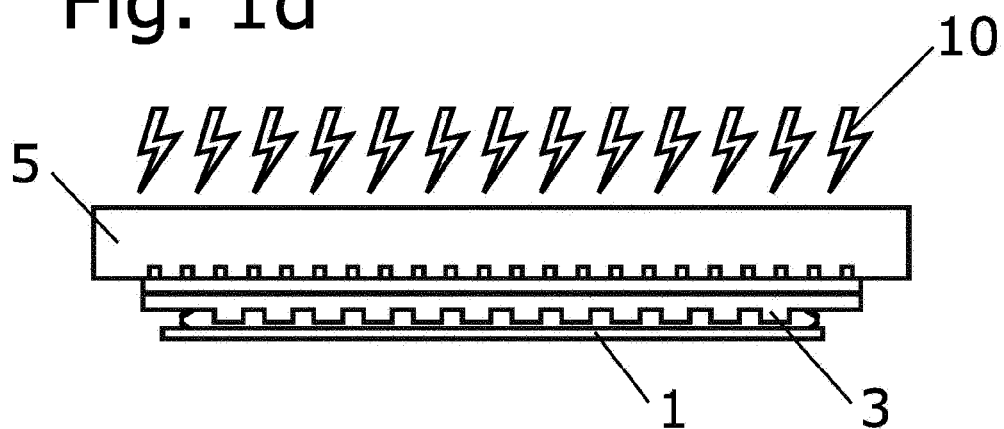
FIG. 1d shows a cross-sectional view of the structured stamp accommodating device in the first embodiment of the method after the embossing or production, wherein the curable embossing material is cross-linked or cured in the stack, in particular through the transparent structured stamp, by means of UV light.

In the next process step according to FIG. 1d, direct cross-linking of curable embossing material 7, in particular photoresist or lacquer, takes place by means of UV light 10. Generally, the curing can be carried out by electromagnetic radiation, by heat, by current, by magnetic fields or other methods. The curing preferably takes place through transparent stamp accommodating device 5 and transparent structured stamp 2. Curing of embossing material 7 by means of a radiation source in or on stamp accommodating device 5 is also conceivable.

Figure 1E:
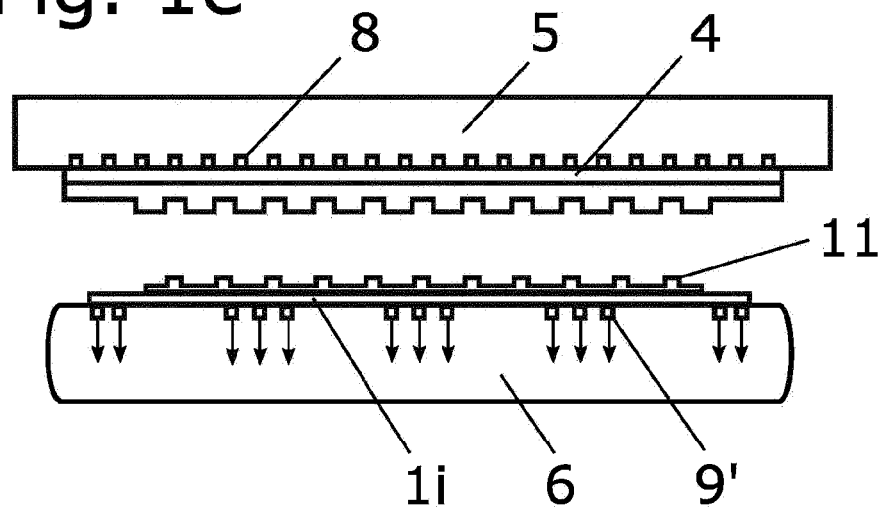
FIG. 1e shows a cross-sectional view of the device after the embossing, wherein removal of the structured stamp and the substrate from the moulding position has taken place after renewed fixing of the embossed substrate on the substrate accommodating device.

In the last process step according to FIG. 1e, the removal of substrate 1 and structured stamp 2 from the moulding position takes place. Substrate 1 is again fixed on substrate accommodating device 6 before the removal. The fixing of substrate 1 takes place by vacuum or underpressure via vacuum tracks 9' of a vacuum device (not represented).

For the removal from the moulding position, all the fixing elements of substrate accommodating device 6, in particular fixing elements 9' separately controllable and distributed uniformly on the accommodating surfaces, are used and activated (activation represented by arrows).

FIG. 1e shows embossed and cured embossing material 11 on substrate 1 after embossing 1i. The method enables a high-resolution structuring in the sub-µm range, preferably less than 20 µm, more preferably less than 2 µm, still more preferably less than 200 nm, most preferably less than 10 nm.

The device preferably comprises a module group with a common work space which can be sealed if required with respect to the surrounding atmosphere. The modules, for example, coating module, imprint module, unloading module, can be arranged in the form of a cluster or star-shaped about a central module with a movement device (robot system).

Figure 3A:
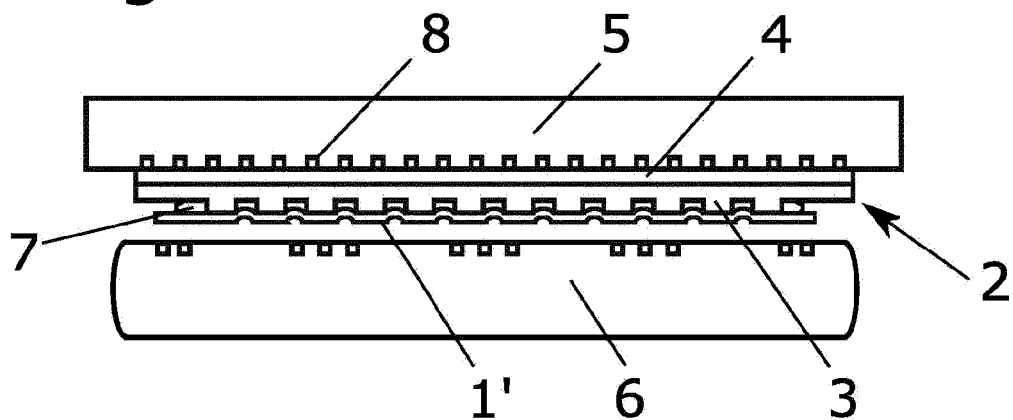
FIG. 3a shows a second cross-sectional view of the device in the first embodiment of the method, wherein the substrate is detached from the substrate accommodating device by interruption of the vacuum in the vacuum tracks and adheres in a conformal manner to the structured stamp due to capillary forces.

FIG. 3a shows an embodiment with an embossed substrate deformation due to the effect of capillary forces after the contacting of substrate 1' and structured stamp 2 with embossing material 7 lying in between. The proportions of the individual components and substrate 1' from FIG. 3a are in part disproportionate, which in particular can be traced back to structures 3 of structured stamp 2 being represented in a much enlarged form. Due to the effect of capillary forces, thin, flexible substrate is drawn in a conformal manner towards structured stamp 2. As a result of the flexibility of substrate and the gained degree of freedom due to the detachment of substrate 1' from substrate accommodating device 6, substrate 1' can be deformed and adapted to structured stamp 2. Uniform contacting during the embossing is thus enabled. For this purpose, at least substrate 1, preferably substrate 1, and structured stamp 2 must have a high degree of flexibility. As a result of the high degree of flexibility of substrate 1, 1' and the conformal contacting, embossing defects are reduced or preferably eliminated.

Embossing defects, which can occur in the prior art of nanoimprint lithography, are, amongst other things, cracks, irregularly filled stamp structures (i.e. air inclusions), and non-uniform lacquer-layer thickness. The adhesion between the embossing material, for example a lacquer, and the structured stamp is critical, since distortions or cracks can occur if for example cured embossing material 11' adheres more strongly in a depression of structured stamp 2, so that an embossed structure can tear during removal from the moulding position. Irregularly filled stamp structures 3 lead to defects of individual embossed structures in cured embossing material 11'. The filling of the stamp structures is dependent on factors such as, amongst other things, the viscosity of embossing material 7, the thickness of the coating or the size and the arrangement of the applied embossing material drops as well as the time.

Further embossing defects originate in particular from defects of structured stamp 2 itself, such as for example a smaller depth of structures 3 in some places or an uneven surface. Defects such as for example an uneven surface of structured stamp 2 are compensated for by the flexibility of substrate 1.

Figure 3B:
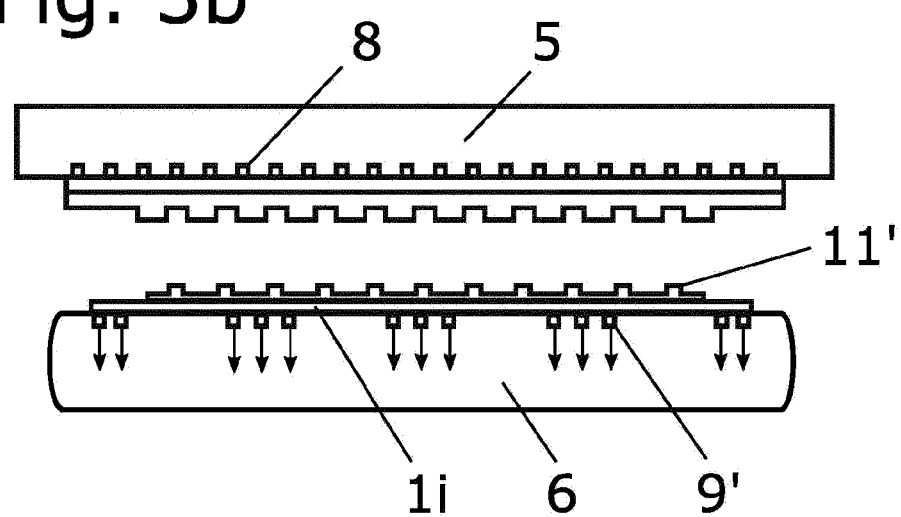
FIG. 3b shows a cross-sectional view of the device after the embossing, wherein a removal of the structured stamp and the substrate from the moulding position has taken place after renewed fixing of the embossed substrate on the substrate accommodating device.

According to the invention, soft structured stamps 2 cannot become deformed during the process, since no external pressure is applied. Substrate 1, 1' is so thin that stamp defects or defects otherwise occurring in the prior art can be compensated for or do not even arise. FIG. 3b shows, after the removal from the moulding position, embossed and cured embossing material 11' on substrate 1i.

The proposed invention can be used in particular for the production of the following products:
1D-, 2D-, and/or 3D diffractive optical elements (DOE),
microfluidic components,
lenses and lens systems,
Fresnel lenses,
biomedicinal elements,
polarisers
nanostructured electrodes,
IR wave conductors,
angular optics for virtual reality applications,
fibre optic connections,
working stamps for imprint lithography and others.

FIGS. 4a to 4d show another embodiment in a step-in-repeat process. A structured stamp 2' is used, which is smaller than substrate 1" on which the structures are to be embossed. According to FIGS. 4a to 4d, the process is repeated as often as required or any number of times, in order to emboss entire substrate 1" with embossing material 7". The equipment according to the invention can preferably be installed in a process chamber, which is hermetically sealed with respect to the surroundings. An evacuation of the process chamber and/or a ventilation of the process chamber with any gas or gas mixture is thus enabled.

Figure 4A:
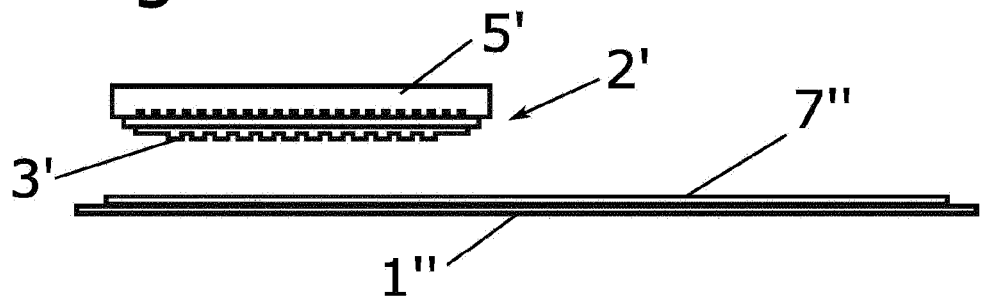
FIG. 4a shows a cross-sectional view of the device in a second embodiment of the method according to the invention.

FIG. 4a shows substrate 1" with a layer of embossing material 7" over the entire area. In another embodiment, drops of the embossing material can be applied on substrate 1" at defined distances. Step-and-repeat structured stamp 2' is smaller than substrate 1". FIG. 4a also shows in particular a cross-sectional view of accommodating device 5' of a device for accommodating structured stamp 2'. Structures 3' of structured stamp 2' have dimensions in the micrometre and/or in the nanometre range. The fixing of structured stamp 2' on stamp accommodating device 5' takes place in a preferred embodiment by means of a vacuum or underpressure via the vacuum tracks of a vacuum device (not represented).

In an advantageous embodiment of the invention, provision is made such that the device comprises curing means for the curing of embossed substrate 1", in particular section by section, sections preferably corresponding with the step-and-repeat process, in particular corresponding to a stamp area of the structured stamp.

The step-and-repeat device is to be regarded as a further development of the device which is described in patent specification EP2287666A1. In EP2287666A1, a step-and-repeat device is described for embossing a substrate in a plurality of embossing steps within the embossing process and the further devices contained in the device, in particular an adjustment device.

Figure 4B:
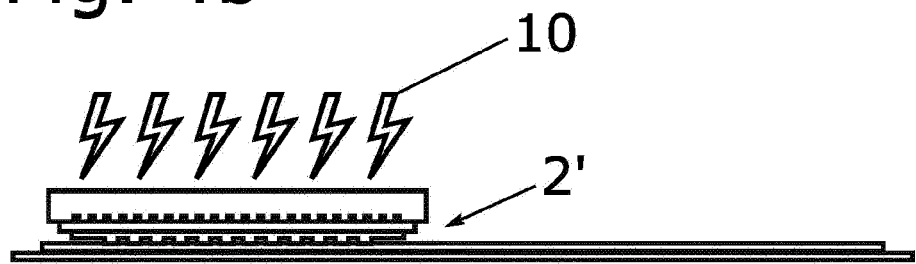
FIG. 4b shows a cross-sectional view of the device in the second embodiment of the method after embossing and curing.

In the process step according to FIG. 4b, embossing material 7" is structured by step-and-repeat structured stamp 2'. Structured stamp 2' is moved to a first position in order to emboss in this first position. Preferably, only structured stamp 2' is brought closer relative to the static carrier substrate. After the contacting, direct cross-linking of curable embossing material 7", in particular photoresist or lacquer, takes place by means of UV light 10. Generally, the curing can be carried out by electromagnetic radiation, by heat, by current, by magnetic fields or other methods. The curing preferably takes place through transparent stamp accommodating device 5' and transparent structured stamp 2'. Curing of embossing material 7" by means of a radiation source in or on stamp accommodating device 5' is also conceivable according to the invention.

Figure 4C:
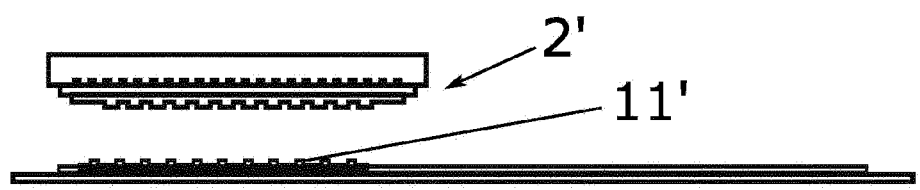
FIG. 4c shows a cross-sectional view of the device in the second embodiment of the method after removal from the moulding position.

After the removal from the moulding position according to FIG. 4c, the defined section of substrate 1" is embossed with a cured embossing material 11'.

Figure 4D:
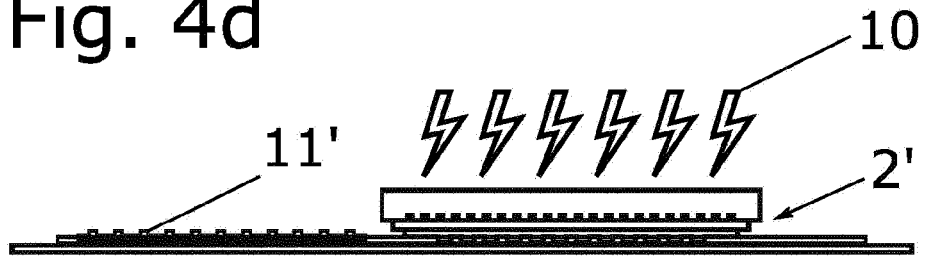
FIG. 4d shows a cross-sectional view of the device in the second embodiment of the method in a second repetition step of the step-and-repeat embossing process.

In a further process step of the step-and-repeat process according to FIG. 4d, step-and-repeat structured stamp 2' moves from the first position to a second predefined position different from the first position and embosses again. After the contacting, direct cross-linking of embossed curable embossing material 7" takes place by means of UV light 10. According to the invention, multiple curing is also conceivable, wherein first curing takes place locally after each individual embossing step and, after completion of the step-and-repeat process, further curing of entire substrate 1" takes place, for example in a separate module.

The process according to FIGS. 4a to 4d can be continued until such time as the desired area of substrate 1" has been embossed. Structured stamp 2' in this embodiment enables, after contacting with embossing material 7" on substrate 1", embossing without an external force effect. The structured stamp has means for movement, in particular parallel to the substrate surface and a lifting system for the approach along the Z-direction and for the removal from the moulding position (not represented). The high degree of precision of the positioning tables of the step-and-repeat device enables seamless embossing with structured stamp 2' at the entire circumference of substrate 1". An alignment with previously embossed structures, in particular for example an overlapping structure at the edge of a previously embossed structure section is possible according to the invention. The use of a continuous substrate is conceivable in the step-and-repeat process. The continuous substrate is in particular a substrate stored on a first roll, the length whereof is many times greater than its width. In particular, the continuous substrate is a film.

By means of embossing carried out repeatedly or beside one another with structured stamp 2', lens arrays for example, in particular micro- and/or nanolens arrays, are produced.

According to the invention, an additional external pressing force is not necessary for successful embossing. According to the invention, stamp accommodating device 5' is brought closer in the predefined position only so far towards substrate 1" that distance H is reduced to a precisely defined final distance $H_E$, so that the imprint process is started without an additional external pressing force being applied. Final position $H_E$ is in particular less than 100 μm, preferably less than 10 μm, most preferably less than 500 nm, with utmost preference less than 100 nm. Through the effect of capillary forces, thin, flexible substrate 1" is drawn in a conformal manner towards structured stamp 2'. As a result of the flexibility of substrate 1", substrate 1" can be deformed and adapted to structured stamp 2'. Uniform contacting during the embossing is thus enabled.

LIST OF REFERENCE NUMBERS

1, 1', 1" Substrate, product substrate
1i Substrate after embossing
2, 2' Structured stamp
3, 3' Embossing structure
4 Stamp carrier substrate or backplate for stabilisation
5, 5' Stamp accommodating device
6 Substrate accommodating device
7, 7', 7" Embossing material
8 Vacuum tracks in the stamp accommodating device
9, 9' Vacuum tracks in the substrate accommodating device
10 Radiation source
11, 11' Embossed and cured embossing material
12 Nozzle
13 Metering device
H Distance
$H_E$ Final distance

What is claimed is:

1. A method for producing micro- and/or nanostructures, comprising:
   a) fixing a substrate on a substrate accommodating device, the substrate having an embossing material thereon,
   b) contacting a structured stamp with the embossing material to structure the embossing material,
   c) at least partially cancelling the fixing of the substrate on the substrate accommodating device,
   d) curing the embossing material on the substrate after the at least partially cancelling of the fixing of the substrate and while the structured stamp is in contact with the embossing material, and
   f) removing the cured embossing material from the structured stamp,
   wherein the substrate is flexible and adaptable to be at least partially conformal with the structured stamp after the at least partial cancelling of the fixing,
   wherein, after the at least partial cancelling of the fixing of the substrate, the substrate is at least partially detached from the substrate accommodating device by moving the substrate accommodating device relative to the substrate and/or moving the substrate accommodating device relative to a stamp accommodating device and/or using capillary forces,
   wherein the embossing material is structured without pressure and/or without contact pressure by capillary forces,
   wherein the substrate with the embossing material is fixed on the substrate accommodating device by means of at least one controllable fixing element arranged in the substrate accommodating device, and the fixing is cancelled by the at least one controllable fixing element, and
   wherein the fixing of the substrate and the at least partial cancelling of the fixing of the substrate is controlled by controlling the at least one controllable fixing element, so that the structuring of the embossing material and/or the detachment of the substrate after the contacting of the structured stamp with the embossing material takes place at a specific time.

2. The method according claim 1, wherein the structured stamp is constituted in such a way that, after the at least partial cancelling of the fixing, the embossing material and/or the substrate are adapted to the structured stamp in a conformal manner without external pressure by capillary forces.

3. The method according to claim 1, wherein the substrate is held by the embossing material by capillary forces, after the contacting and/or after the at least partial cancelling of the fixing.

4. The method according to claim 1, wherein the micro- and/or nanostructures are produced above one another in a plurality of layers and/or beside one another in a step-and-repeat process.

5. The method according to claim 1, wherein a thickness of the substrate lies between 1 μm and 2000 μm.

6. The method according to claim 1, wherein a viscosity of the embossing material amounts to less than 100,000 cP.

7. The method according to claim 1, wherein the structured stamp comprises an embossing structure and/or is coated with an embossing structure.

8. An article comprising the micro- and/or nanostructures produced with the method according to claim 1.

9. A device for producing micro- and/or nanostructures, comprising:
   movement means to bring a structured stamp into contact with embossing material on a substrate, at least one fixing element configured to fix the substrate with the embossing material on a substrate accommodating device such that the fixing of the substrate is at least partially cancellable, the at least one fixing element being configured to fix the substrate with the embossing material on the substrate accommodating device prior to the structured stamp being brought into contact with the embossing material by the movement means, the fixing of the substrate being at least partially cancellable after the structured stamp is brought into contact with the embossing material by the movement means, curing means to cure the embossing material after the fixing of the substrate is at least partially cancelled, and removal means to remove the embossing material from the structured stamp, wherein the substrate is flexible and adaptable to be at least partially conformal with the structured stamp after the fixing of the substrate is at least partially cancelled, wherein, after the at least partial cancelling of the fixing of the substrate, the substrate is at least partially detached from the substrate accommodating device by moving the substrate accommodating device relative to the substrate and/or moving the substrate accommodating device relative to a stamp accommodating device and/or using capillary forces, wherein the embossing material is structured without pressure and/or without contact pressure by capillary forces, wherein the substrate with the embossing material is fixed on the substrate accommodating device by means of at least one controllable fixing element arranged in the substrate accommodating device, and the fixing is cancelled by the at least one controllable fixing element, and wherein the fixing of the substrate and the at least partial cancelling of the fixing of the substrate is controlled by controlling the at least one controllable fixing element, so that the structuring of the embossing material and/or the detachment of the substrate after the contacting of the structured stamp with the embossing material takes place at a specific time.

10. The device according to claim 9, further comprising:

one or more sensors for measurement of pressure, distances and/or temperatures, and one or more actuators for adjustment of a stamp accommodating device and/or the substrate accommodating device, and a control unit, wherein the control unit is configured to control the at least one fixing element and/or the at least one actuator depending on a value measured by the at least one sensor, and wherein the movement means is configured to relatively move the structured stamp with respect to the substrate with the embossing material, resulting in a creation or a reduction of a spacing between the structured stamp and the substrate, to carry out the contacting of the structured stamp with the embossing material on the substrate without pressure.

11. An article comprising the micro- and/or nanostructures produced by the device of claim 9.

* * * * *